(12) United States Patent
Joyce (10) Patent No.: US 12,055,589 B1
(45) Date of Patent: Aug. 6, 2024

(54) CONTACTOR DRIVES HAVING NORMALLY-ON SOLID STATE SWITCHES

(71) Applicant: Hamilton Sundstrand Corporation, Charlotte, NC (US)

(72) Inventor: Thomas P. Joyce, Rockford, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 18/097,139

(22) Filed: Jan. 13, 2023

(51) Int. Cl.
*H01H 47/32* (2006.01)
*G01R 31/327* (2006.01)

(52) U.S. Cl.
CPC ......... *G01R 31/3278* (2013.01); *H01H 47/32* (2013.01)

(58) Field of Classification Search
CPC ............................. H01H 47/32; G01R 31/3278
See application file for complete search history.

(56) References Cited

U.S. PATENT DOCUMENTS

| | | | |
|---|---|---|---|
| 5,134,323 A | 7/1992 | Congdon | |
| 5,400,202 A * | 3/1995 | Metz | H01L 27/0262 361/111 |
| 5,528,188 A * | 6/1996 | Au | H01L 27/0259 327/310 |
| 6,618,233 B1 * | 9/2003 | Russ | H01L 27/0262 361/111 |
| 8,120,887 B2 * | 2/2012 | Mallikararjunaswamy | H01L 27/0262 361/111 |
| 8,861,162 B2 | 10/2014 | Fuller et al. | |
| 8,981,740 B2 * | 3/2015 | van den Broeke | H02M 3/158 323/267 |
| 9,711,309 B2 | 7/2017 | McCormick et al. | |
| 9,985,453 B2 | 5/2018 | Namou et al. | |
| 10,554,201 B2 | 2/2020 | Cairoli et al. | |
| 11,488,798 B2 * | 11/2022 | Joyce | H01H 47/325 |
| 2004/0207020 A1 * | 10/2004 | Chen | H01L 29/87 257/E29.225 |
| 2005/0110092 A1 * | 5/2005 | Chen | H01L 29/87 257/E29.225 |

(Continued)

FOREIGN PATENT DOCUMENTS

CN 202749327 U * 2/2013
CN 103683883 B * 12/2015

(Continued)

OTHER PUBLICATIONS

Partial European Search Report dated Jun. 7, 2024 in connection with European Patent Application No. 24151457.9, 24 pages.

*Primary Examiner* — Sisay G Tiku (57) ABSTRACT

A low-side contactor coil drive circuit can include an input line and a first solid state switch having a first switch base, a first switch collector, and a first switch emitter. The first switch collector can be connected to the input line and the first switch emitter is connected to ground. The circuit can include a second solid state switch having a second switch base, a second switch collector, and a second switch emitter. The second switch emitter can be connected to the input line in parallel with the first switch collector. The second switch collector can be connected to the first switch base. The circuit can include a third solid state switch having a third switch gate, a third switch source, and a third switch drain. The third switch drain can be connected to the second switch base.

20 Claims, 7 Drawing Sheets

(56) References Cited

U.S. PATENT DOCUMENTS

| | | | |
|---|---|---|---|
| 2005/0286188 A1* | 12/2005 | Camp | H01L 27/0262 |
| | | | 361/56 |
| 2006/0012336 A1* | 1/2006 | Fujita | H01M 50/569 |
| | | | 320/119 |
| 2007/0069310 A1* | 3/2007 | Song | H01L 27/0262 |
| | | | 257/E29.225 |
| 2007/0127180 A1* | 6/2007 | Lin | H03K 17/284 |
| | | | 361/93.7 |
| 2009/0294855 A1* | 12/2009 | Lim | H01L 27/0259 |
| | | | 257/355 |
| 2014/0054643 A1* | 2/2014 | Chen | H01L 27/0262 |
| | | | 257/137 |
| 2017/0110970 A1* | 4/2017 | Larosa | H02M 1/42 |
| 2017/0194788 A1* | 7/2017 | Smith | H01L 27/0266 |
| 2017/0287895 A1* | 10/2017 | Wang | H01L 29/7436 |
| 2023/0012301 A1* | 1/2023 | Xu | H02H 9/046 |
| 2023/0040961 A1* | 2/2023 | Hernandez | G01R 31/3004 |
| 2023/0290771 A1* | 9/2023 | Eom | H02H 9/046 |
| 2023/0307438 A1* | 9/2023 | Eom | H01L 29/87 |

FOREIGN PATENT DOCUMENTS

| | | | | |
|---|---|---|---|---|
| CN | 106683946 B | | 6/2018 | |
| CN | 216356459 U | * | 4/2022 | |
| EP | 0772237 A2 | * | 5/1997 | |
| GB | 2268007 A | * | 12/1993 | H01L 27/0251 |
| JP | H0653407 A | * | 6/1995 | |
| JP | H07162279 A | * | 6/1995 | |
| KR | 100642651 B1 | * | 11/2006 | |
| WO | WO-02075891 A1 | * | 9/2002 | H01L 27/0251 |

* cited by examiner

CONTACTOR DRIVES HAVING NORMALLY-ON SOLID STATE SWITCHES

FIELD

This disclosure relates to contactor drives.

BACKGROUND

In aerospace electrical system electronic controllers, it is often necessary for low-side contactor coil drives to be in the on-state (allowing current to flow) when the controller is not powered. Certain electrically held contactor coil drives also should be able to support transient currents in the range of approximately 1-10 A and steady-state hold currents in the range of approximately 0.1-1 A, so low-power solid-state devices like JFETs are not considered practical solutions as the pass element in these coil drives. Traditional systems most commonly use relays configured with the relay contact connecting the output to ground when the relay coil is in the de-energized state. However, relays suffer from high cost, reliability problems, and require a large physical area.

Such conventional methods and systems have generally been considered satisfactory for their intended purpose. However, there is still a need in the art for improvements. The present disclosure provides a solution for this need.

SUMMARY

A low-side contactor coil drive circuit can include an input line and a first solid state switch having a first switch base, a first switch collector, and a first switch emitter. The first switch collector can be connected to the input line and the first switch emitter is connected to ground. The circuit can include a second solid state switch having a second switch base, a second switch collector, and a second switch emitter. The second switch emitter can be connected to the input line in parallel with the first switch collector. The second switch collector can be connected to the first switch base. The circuit can include a third solid state switch having a third switch gate, a third switch source, and a third switch drain. The third switch drain can be connected to the second switch base.

In certain embodiments, the circuit can include a solid state switch controller connected to the third switch gate and configured to control a state of the third solid state switch. In certain embodiments, the first solid state switch can be a NPN BJT. In certain embodiments, the second solid state switch can be a PNP BJT. In certain embodiments, the third solid state switch can be an N-channel JFET.

In certain embodiments, the third solid state switch can be normally on such that if the solid state switch controller is unpowered the third solid state switch is on. The solid state switch controller can be configured to pull the third switch gate low to turn of the third solid state switch off. In certain embodiments, the solid state switch controller can include an optocoupler, for example.

In certain embodiments, the circuit can include a first resistor disposed on the input line and configured to allow current sensing. In certain embodiments, the circuit can include a second resistor connected to the second switch collector in parallel with the first switch base on an first side of the second resistor. The second resistor can be connected to ground on a second side of the second resistor. In certain embodiments, the circuit can include a third resistor connected to the input line in parallel with the first switch collector and the second switch emitter on a first side of the third resistor. The third resistor can be connected to the third switch drain in parallel with the second switch base on a second side of the third resistor. The second resistor and the third resistor can be configured to reduce leakage current to prevent the first solid state switch and the second solid state switch from turning on when the third solid state switch is off.

In certain embodiments, the circuit can include a fourth resistor connected between the third switch gate and ground. The fourth resistor can be connected to the third switch gate in parallel with the solid state switch controller.

In certain embodiments, current on the input line can be between 0.1 A to 1 A steady state current, and/or between 1 A to 10 A transient current, for example. In certain embodiments, the circuit only has solid state components and does not include any non-solid state components.

In accordance with at least one aspect of this disclosure, a low-side contactor coil drive circuit can include a plurality of solid state switches, at least one of which configured to pass a load current, a normally-on solid state switch that is not capable of passing the load current, the normally-on solid state switch operatively connected to the plurality of solid state switches and configured to control a state of the plurality of solid state switches, and a solid state switch controller connected to the normally-on solid state switch configured to control a state of the normally-on solid state switch. The plurality of solid state switches can include an NPN BJT, a PNP BJT, and an N-channel JFET. The solid state switch controller can include an optocoupler.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein:

FIG. 4C shows the embodiment of FIG. 1, showing a current path through the second switch base of the second solid state switch to the third solid state switch when the third solid state switch is turned on;

DETAILED DESCRIPTION

Reference will now be made to the drawings wherein like reference numerals identify similar structural features or aspects of the subject disclosure. For purposes of explanation and illustration, and not limitation, an illustrative view of an embodiment of a circuit in accordance with the disclosure is shown in FIG. 1 and is designated generally by reference character 100.

Other embodiments and/or aspects of this disclosure are shown in FIGS. 2-4H. Certain embodiments described herein can be used to provide an all solid state circuit for high current systems.

Figure 1:
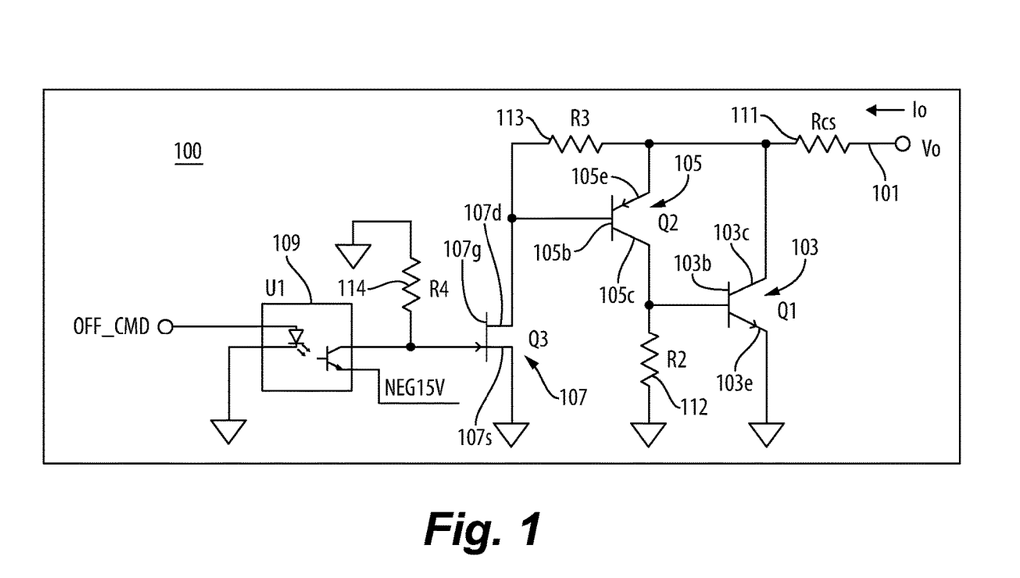
FIG. 1 is a is a circuit diagram of an embodiment of a circuit in accordance with this disclosure.

Referring to FIG. 1, a low-side contactor coil drive circuit 100 can include an input line 101 and a first solid state switch 103 (Q1) having a first switch base 103b, a first switch collector 103c, and a first switch emitter 103e. The first switch collector 103c can be connected to the input line 101 (e.g., through a current sense resistor Rcs) and the first switch emitter 103e can be connected to ground (e.g., a sink), e.g., as shown. The circuit 100 can include a second solid state switch 105 (Q2) having a second switch base 105b, a second switch collector 105c, and a second switch emitter 105e. The second switch emitter 105e can be connected to the input line 101 in parallel with the first switch collector 103c, e.g., as shown. The second switch collector 105c can be connected to the first switch base 103b, e.g., as shown.

The circuit 100 can include a third solid state switch 107 (Q3) having a third switch gate 107g, a third switch source 107s, and a third switch drain 107d. The third switch drain 107d can be connected to the second switch base 105b, for example.

In certain embodiments, the circuit 100 can include a solid state switch controller 109 (U1) connected to the third switch gate 107g and configured to control a state of the third solid state switch 107. In certain embodiments, the first solid state switch 103 can be a NPN BJT, e.g., as shown. In certain embodiments, the second solid state switch 105 can be a PNP BJT, e.g., as shown. In certain embodiments, the third solid state switch 107 can be an N-channel JFET, e.g., as shown.

In certain embodiments, the third solid state switch 107 can be normally on such that if the solid state switch controller 109 is unpowered, the third solid state switch 107 is on (e.g., allowing flow through to ground). The third solid state switch 107 can include a characteristic on-state drain-source resistance (e.g., 50 Ohms) such that current through the third solid state switch 107 is substantially lower than the current on the input line 101 (e.g., 3 orders of magnitude lower). The solid state switch controller 109 can be configured to pull the third switch gate 107g low to turn of the third solid state switch 107 off.

In certain embodiments, the solid state switch controller 109 can include an optocoupler, for example, e.g., as shown. An optocoupler is an example of a switch type that is solid state to allow the entire circuit 100 to be solid state, for example. Any other suitable solid state controller 109 is contemplated herein.

In certain embodiments, the circuit 100 can include a first resistor 111 (Rcs) disposed on the input line 101 and configured to allow current sensing, for example. In certain embodiments, the circuit 100 can include a second resistor 112 (R2) connected to the second switch collector 105c in parallel with the first switch base 103b on a first side of the second resistor 112, e.g., as shown. The second resistor 112 can be connected to ground on a second side of the second resistor 112, e.g., as shown. In certain embodiments, the circuit 100 can include a third resistor 113 (R3) connected to the input line 101 in parallel with the first switch collector 103c and the second switch emitter 103e on a first side of the third resistor 113. The third resistor 113 can be connected to the third switch drain 107d in parallel with the second switch base 105b on a second side of the third resistor 113. The second resistor 112 and the third resistor 113 can be configured to reduce leakage current to prevent the first solid state switch 103 and the second solid state switch 105 from turning on when the third solid state switch 107 is off.

In certain embodiments, the circuit 100 can include a fourth resistor 114 (R4) connected between the third switch gate 107g and ground. The fourth resistor 114 can be connected to the third switch gate 107g in parallel with the solid state switch controller 109, e.g., as shown.

In certain embodiments, current on the input line 101 can be between 0.1 A to 1 A steady state current, and/or between 1 A to 10 A transient current, for example. In certain embodiments, voltage on the input line 101 can be on the order of 1 V (e.g., 1.5 V). In certain embodiments, the circuit 100 only has solid state components and does not include any non-solid state components (e.g., no relays, for example).

Figure 2:
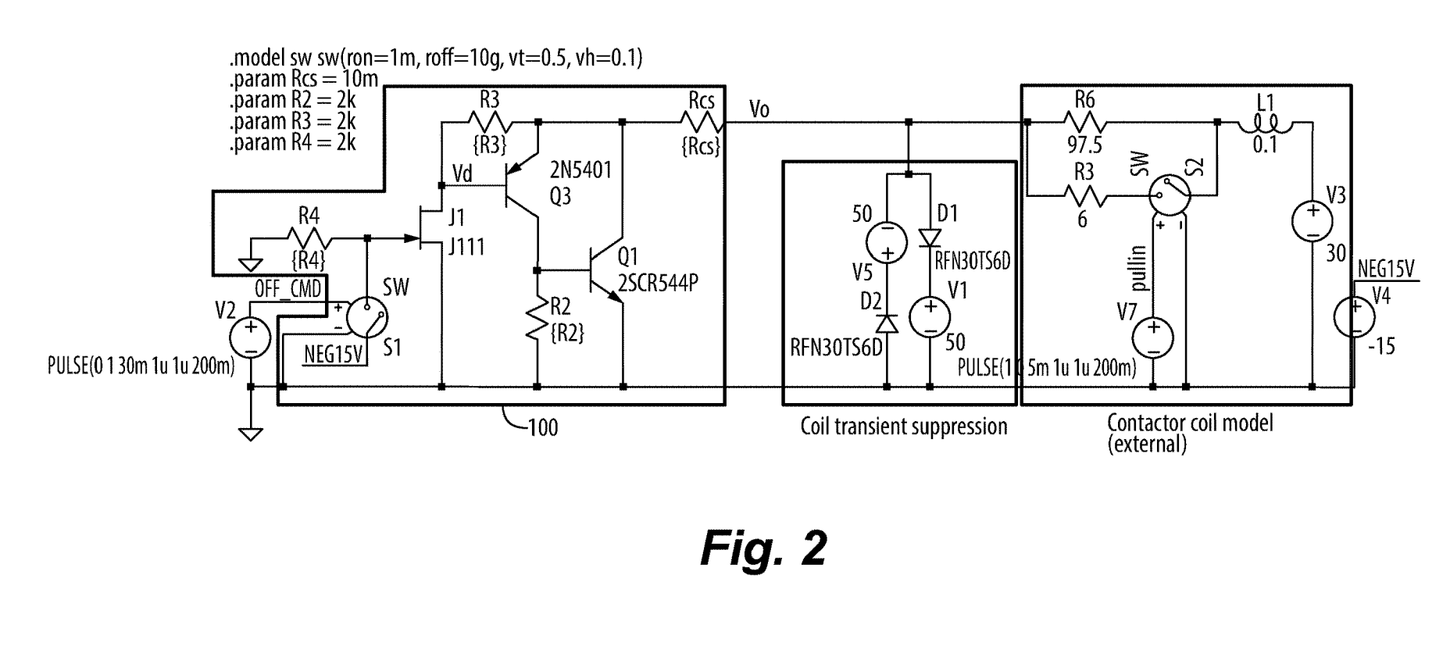
FIG. 2 is a circuit diagram of an embodiment of a simulation circuit in accordance with this disclosure, shown having the circuit of FIG. 1.
Figure 3:
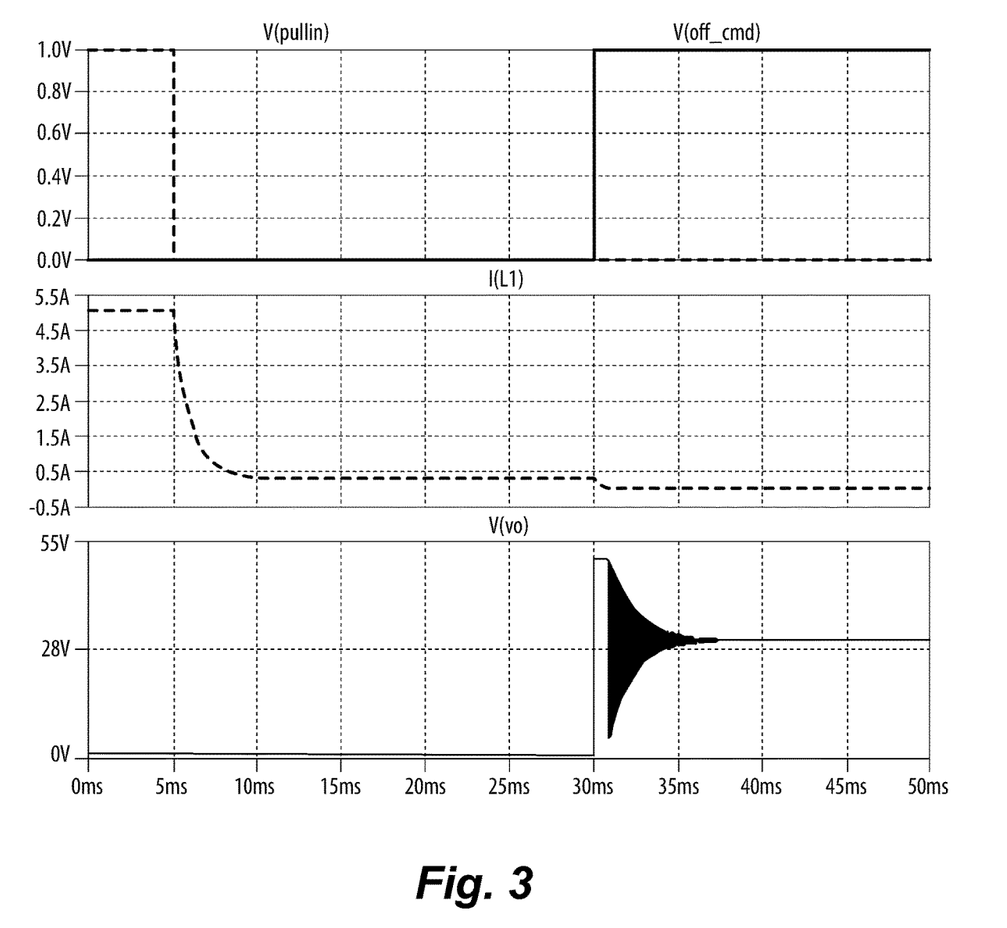
FIG. 3 shows result of the simulation circuit of FIG. 2.

FIG. 2 is a circuit diagram of an embodiment of a simulation circuit in accordance with this disclosure, shown having the circuit of FIG. 1. FIG. 3 shows result of the simulation circuit of FIG. 2. As shown, at 0-5 ms, there is 1.4 V output at 5 A pull-in. At 5-30 ms, there is 0.7 V output at 0.3 A hold current. At 30-50 ms, an off command is sent causing coil flyback then reduction to zero current.

Figure 4A:
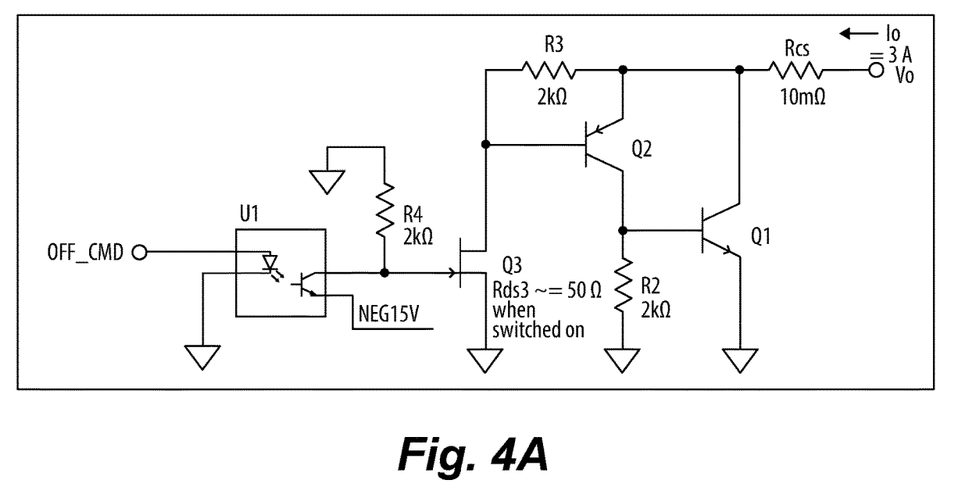
FIG. 4A shows the embodiment of FIG. 1 having an embodiment of current and resistance values.

FIG. 4A shows the embodiment of FIG. 1 having an embodiment of current and resistance values. Shown is an application with a 3 A load input current.

Figure 4B:
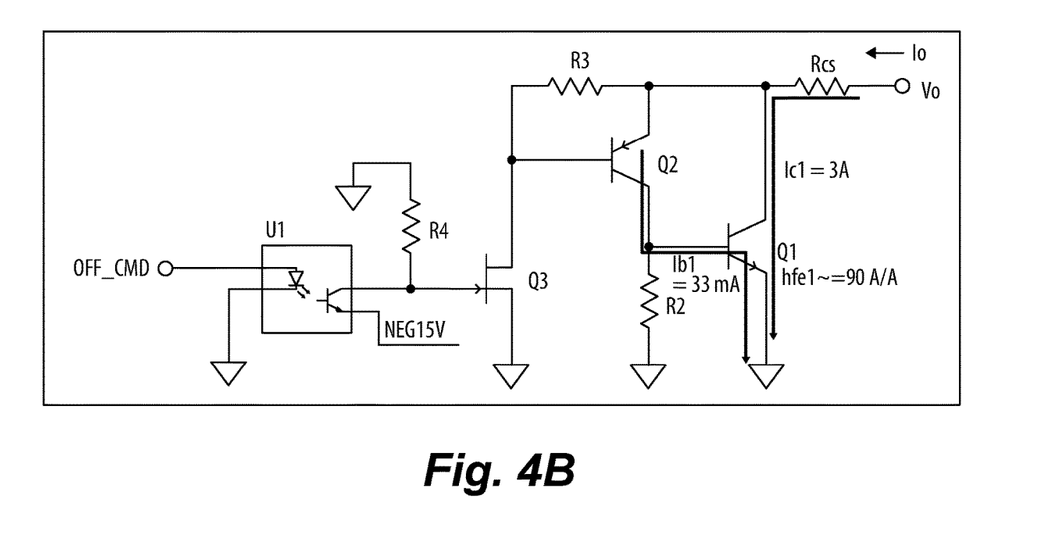
FIG. 4B shows the embodiment of FIG. 1, showing certain current paths through the first solid state switch and the second solid state switch when the third solid state switch is turned on, showing example current values.

FIG. 4B shows the embodiment of FIG. 1, showing certain current paths through the first solid state switch 103 and the second solid state switch 105 when the third solid state switch 107 is turned on, showing example current values. When switched on, the circuit 100 will sink the load current primarily through the switch Q1 collector. To allow a 3 A sink current, the switch Q1's base current must be the load current divided by the switch Q1's current gain (hfe1) which is shown as 90 A/A for example. Calculation of minimum base current is as follows:

$Ib1(min)=3 \text{ A}/(hfe1)$ $Ib1(min)=3 \text{ A}/(90 \text{ A/A})$ $Ib1(min)=33 \text{ mA}.$ Therefore, in this example, switch Q2 collector current must provide at least 33 mA to the Q1 base to turn on switch Q1.

Figure 4C:
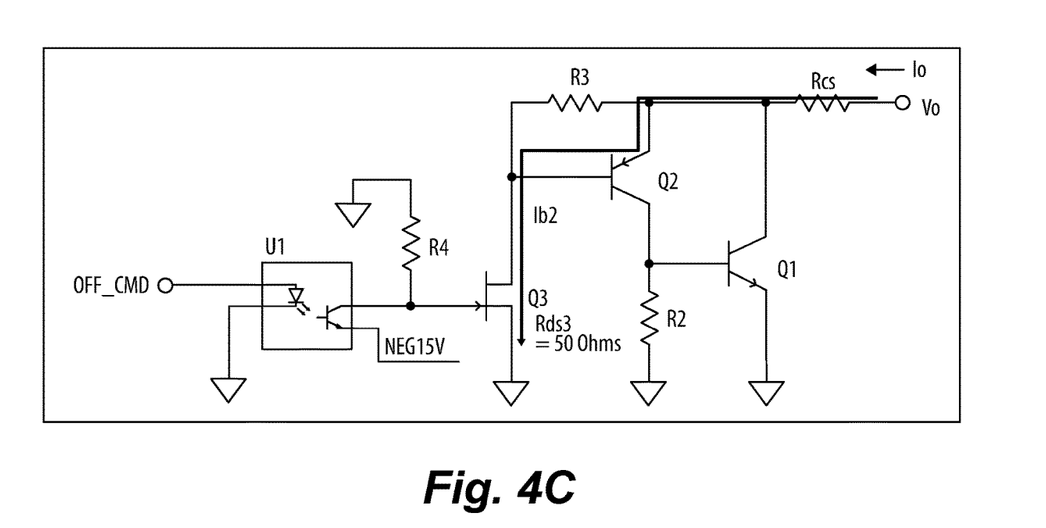

FIG. 4C shows the embodiment of FIG. 1, showing a current path through the second switch base 105b of the second solid state switch 105 to the third solid state switch 107 when the third solid state switch 107 is turned on. As shown, with switch Q3 switched on, base current will flow through switch Q2.

Figure 4D:
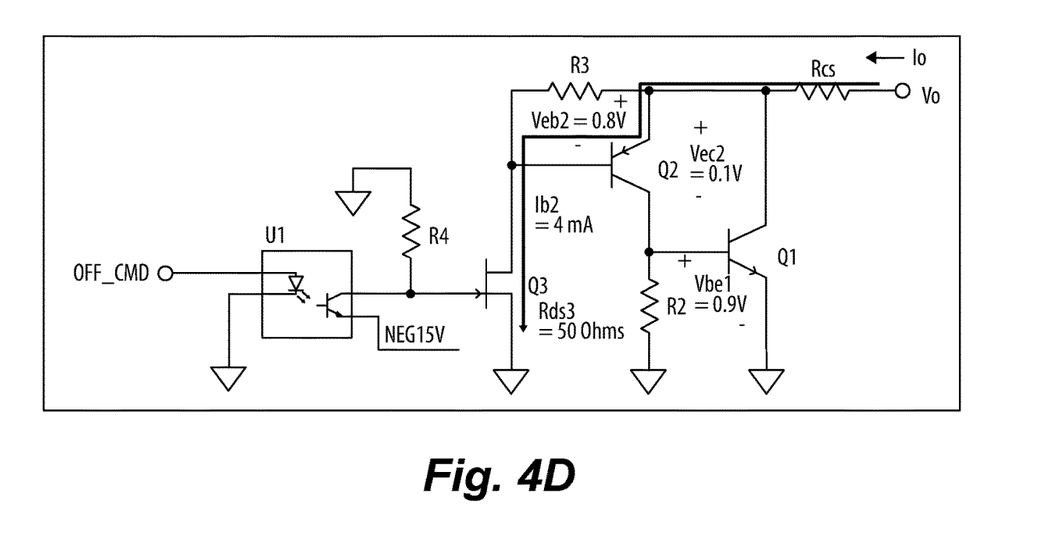
FIG. 4D shows the embodiment of FIG. 1, showing the current paths of FIG. 4C, showing example current and voltage values.

FIG. 4D shows the embodiment of FIG. 1, showing the current paths of FIG. 4C, showing example current and voltage values. Switch Q2 base current flows through switch Q3. The current through Q3 Ib2 is calculated as:

$$Ib2 \sim = (Vbe1 + Vec2 - Veb2)/Rds3$$

$$Ib2 \sim = (0.9\ V + 0.1\ V - 0.8\ V)/50\Omega$$

$$Ib2 \sim = (0.9\ V + 0.1\ V - 0.8\ V)/50\Omega$$

$$Ib2 \sim = 4\ mA$$

The voltages Vbe1, Vec2, Veb2 are characteristics of the transistors when operating in the shown application.

Figure 4E:
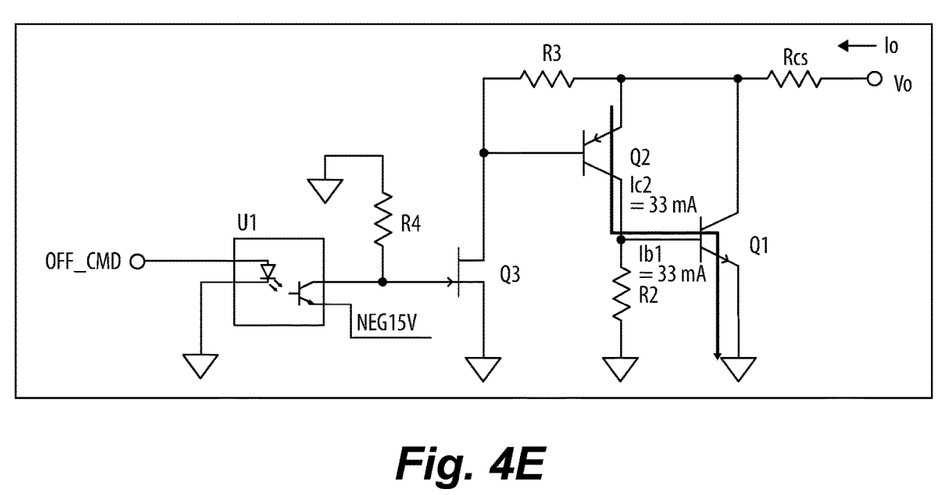
FIG. 4E shows the embodiment of FIG. 1, showing a current path through the second switch base of the second solid state switch to the base of the first solid state switch when the third solid state switch is turned on, showing example minimum current values.

FIG. 4E shows the embodiment of FIG. 1, showing a current path through the second switch base 105b of the second solid state switch 105 to the base 103b of the first solid state switch 103 when the third solid state switch 107 is turned on, showing example minimum current values. Switch Q2 collector current provides base current Ic2 to switch Q1. As shown above, in the example shown, this must be a minimum of 33 mA when limited by its current gain, which is calculated as:

$$Ic2 = Ib2 * hfe2$$

$$Ic2 = 4\ mA * 130\ A/A$$

$$Ic2 = 4\ mA * 130\ A/A$$

$$Ic2 = 520\ mA \rightarrow 520\ mA > 33\ mA$$

This example design as shown provides enough gain to satisfy the current demanded by the load with significant margin. Because switch Q2 output current is not limited by its current gain, it acts as an on-state switch with low Vec output voltage drop.

Figure 4F:
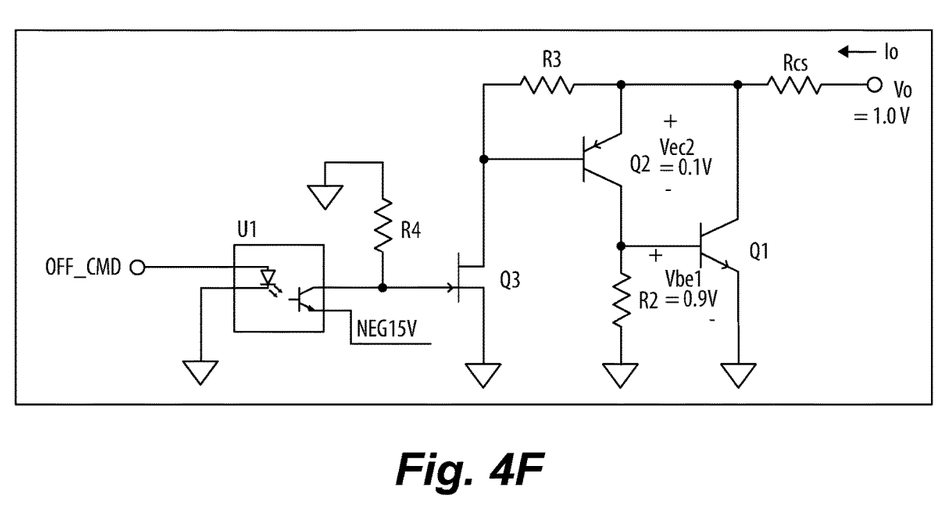
FIG. 4F shows the embodiment of FIG. 1, showing example voltage values with an input voltage of 1V.

FIG. 4F shows the embodiment of FIG. 1, showing example voltage values with an input voltage of 1 V. The output voltage has a low drop from ground, which can be an important characteristic of this circuit in certain applications. Vo can be calculated as:

$$Vo = Vbe1 + Vec2 + (Rcs * Io)$$

$$Vo = 0.9\ V + 0.1\ V + (10\ m\Omega * 3\ A)$$

$$Vo = 1.0\ V$$

Figure 4G:
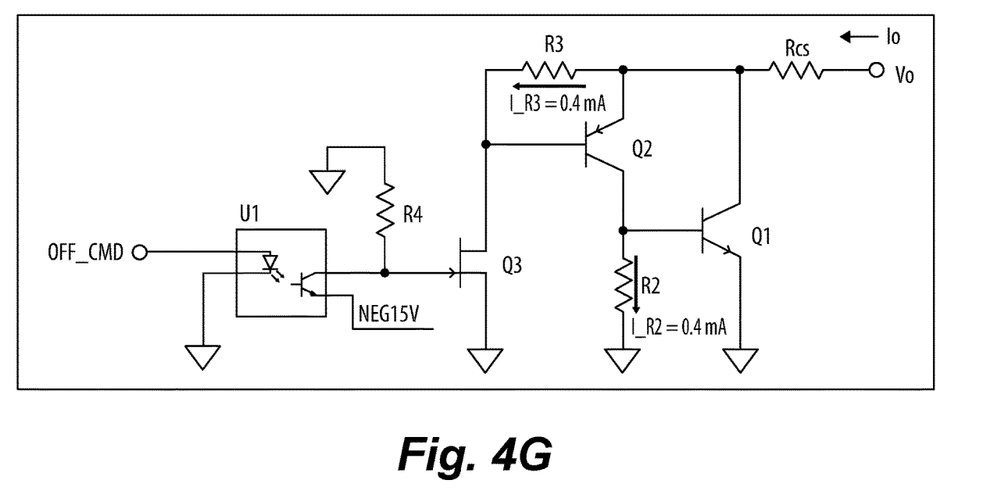
FIG. 4G shows the embodiment of FIG. 1, showing example leakage current reduced by resistors when the third solid state switch is off.

FIG. 4G shows the embodiment of FIG. 1, showing example leakage current reduced by resistors when the third solid state switch is off. Currents though resistors R3 and R2 are small (less than 1 mA) and are calculated as:

$$I\_R3 = Veb2/R3$$

$$I\_R3 = 0.8V/2\ kM$$

$$I\_R3 = 0.4\ mA$$

$$I\_R2 = Vbe1/R2$$

$$I\_R2 = 0.9V/2\ kM$$

$$I\_R2 = 0.45\ mA$$

Figure 4H:
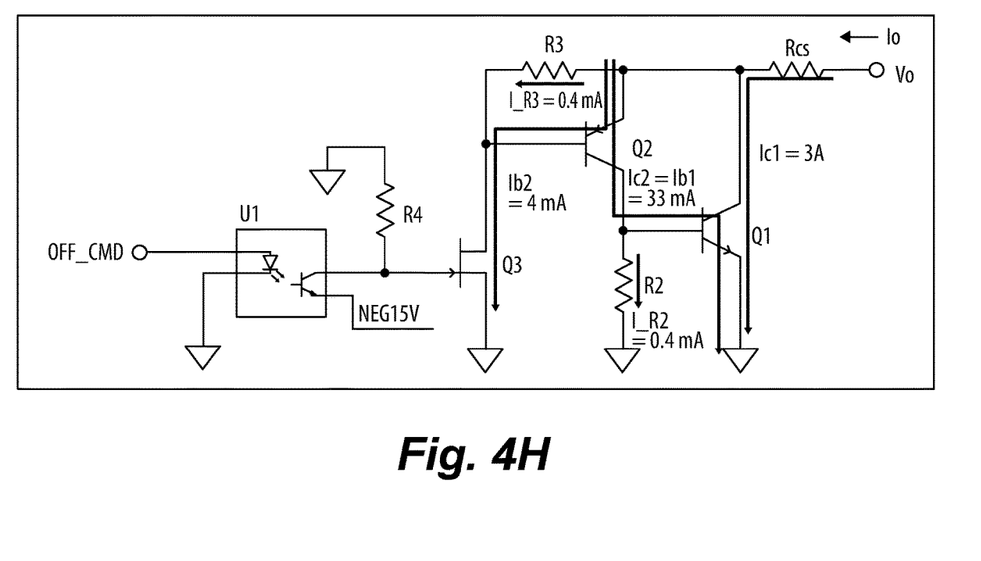
FIG. 4H shows the embodiment of FIG. 1, showing all current paths through the circuit combined.

These components can be implemented to ensure that the circuit is fully off when switch Q3 switches off. FIG. 4H shows the embodiment of FIG. 1, showing all current paths through the circuit 100 combined. FIG. 4H In accordance with at least one aspect of this disclosure, a low-side contactor coil drive circuit can include a plurality of solid state switches, at least one of which configured to pass a load current, a normally-on solid state switch that is not capable of passing the load current, the normally-on solid state switch operatively connected to the plurality of solid state switches and configured to control a state of the plurality of solid state switches, and a solid state switch controller connected to the normally-on solid state switch configured to control a state of the normally-on solid state switch. The plurality of solid state switches can include an NPN BJT, a PNP BJT, and an N-channel JFET. The solid state switch controller can include an optocoupler.

Certain embodiments can include a low side contactor coil drive that in use is required to be on even when the controller doesn't have power to it. Traditional systems use mechanical relays (e.g., having mechanical contacts). Certain embodiments provide a solid state solution that can operate with high current and a low voltage drop. JFETs, for example, can be on by default, and the gate must be pulled low to turn the JFET off. However, JFETs cannot be used for the power stage because JFETs cannot handle high current (e.g., transient 1-10 A and steady state 0.1 to 1 A). For example, in the embodiment as shown, the switch Q3 is always on and can only be turned off when power to the controller U1 is on and it is commanded. When the gate of Q3 is equal to the source of Q3, the gate of Q3 is on. When there is no power to the controller U1, the voltage the gate of Q3 sees cannot be changed and will be grounded through R4. When U1 has power, it can pull the voltage to the NEG15V signal (negative voltage) to turn off Q3. The optocoupler provides a way to translate a command to turn the switch with solid state components, and without relays or mechanical components. Switch Q2 and switch Q1 can be BJTs which are a current amplifier. Without current flow, they are shut off. So when Q3 is off, Q1 and Q2 are off and do not allow flow (except possible minor leakage flow). Resistors R2 and R3 mitigate the leakage current to prevent amplification of leakage current through switches Q2 and Q1 while the switch Q3 is off. The gain for each BJT switch Q1 and Q2 can be 20 times to 500 times for example.

With switch Q3 on, current flows from the input line 101 through the emitter of switch Q2 to the base of switch Q2 to ground through switch Q2. This turns on switch Q2. As switch Q3 as a JFET has some resistance (e.g., 50 Ohms), this reduces current through Q2, and this can be the limiting factor preventing all input current (Io) from passing through switch Q2 to ground. Current is then passed through the collector of switch Q2 which is multiplied by the gain of switch Q2. Then most of the switch Q2 collector current goes through to the base of switch Q1 to the emitter of switch Q1. This current is multiplied by the gain of switch Q1. This turns on switch Q1 and input current (Io) can flow through switch Q1 to ground/sink. In the system as shown, only about 1% of total current is used as control current that travels through switch Q3 to ground, for example.

Embodiments can include a normally-on solid-state low-side contactor drive. Certain embodiments can allow a solid-state solution for a normally-on, high-current, low-side contactor coil drive. The main pass element can be an NPN BJT (e.g., Q1 in FIG. 1), with its base current controlled by a PNP BJT (e.g., Q2 in FIG. 1). The PNP BJT's base current can be controlled by an N-channel JFET (e.g., Q3 in FIG. 1) which can be normally on without control circuitry to turn it off. The JFET source can be connected to ground and its gate can be connected to ground through a resistor (e.g., R4 in FIG. 1), and can switch to a connection to −15V through an optocoupler control output (e.g., U1 in FIG. 1) to turn the main output off. Base-emitter resistors (e.g., R2 and R3 in FIG. 1) can ensure that the circuit will not inadvertently turn on due to transistor leakage current when it is commanded off. A small-value current-sense resistor (e.g., Rcs in FIG. 1) can allow for overcurrent protection if sensing circuitry is added across the current-sense resistor, for example.

Embodiments of an architecture can be designed to output a low voltage while sinking large contactor coil current. The circuit can default to the on state (allowing current to flow) when the on/off control signal is high-impedance or 0 V, and can turn off when a low-voltage logic-high control signal is applied, for example.

In certain electronics (e.g., aerospace applications), it is often necessary for low-side contactor coil drives to be in the on-state when the controller is not powered. These coil drives also may have to support large currents, so low-power solid-state devices like JFETs are not practical solutions as the pass element in these coil drives. Therefore, relays are typically used for these circuits, however, relays suffer from high cost, large board area, and sometimes reliability problems. Embodiments allow a solid-state solution to the normally-on, high-current, low-side contactor coil drive. Embodiments can also include a small current-sense resistor allows for overcurrent protection.

Embodiments can include any suitable computer hardware and/or software module(s) to perform any suitable function (e.g., as disclosed herein). For example, embodiments can include a control module configured to control the controller 109.

As will be appreciated by those skilled in the art, aspects of the present disclosure may be embodied as a system, method or computer program product. Accordingly, aspects of this disclosure may take the form of an entirely hardware embodiment, an entirely software embodiment (including firmware, resident software, micro-code, etc.), or an embodiment combining software and hardware aspects, all possibilities of which can be referred to herein as a "circuit," "module," or "system." A "circuit," "module," or "system" can include one or more portions of one or more separate physical hardware and/or software components that can together perform the disclosed function of the "circuit," "module," or "system", or a "circuit," "module," or "system" can be a single self-contained unit (e.g., of hardware and/or software). Furthermore, aspects of this disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of this disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of this disclosure may be described above with reference to flowchart illustrations and/or block diagrams of methods, apparatus (systems) and computer program products according to embodiments of this disclosure. It will be understood that each block of any flowchart illustrations and/or block diagrams, and combinations of blocks in any flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in any flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified herein.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:

1. A low-side contactor coil drive circuit, comprising:
   an input line;
   a first solid state switch having a first switch base, a first switch collector, and a first switch emitter, wherein the first switch collector is connected to the input line and the first switch emitter is connected to ground;
   a second solid state switch having a second switch base, a second switch collector, and a second switch emitter, wherein the second switch emitter is connected to the input line in parallel with the first switch collector, wherein the second switch collector is connected to the first switch base;
   a third solid state switch having a third switch gate, a third switch source, and a third switch drain, wherein the third switch drain is connected to the second switch base; and
   a solid state switch controller connected to the third switch gate and configured to control a state of the third solid state switch;
   wherein the third solid state switch is normally on such that, if the solid state switch controller is unpowered, the third solid state switch is on, the solid state switch controller configured to pull the third switch gate low to turn the third solid state switch off.

2. The circuit of claim 1, wherein the third solid state switch includes a characteristic on-state drain-source resistance such that current through the third solid state switch is substantially lower than current on the input line.

3. The circuit of claim 1, wherein the first solid state switch is an NPN bipolar junction transistor (BJT).

4. The circuit of claim 3, wherein the second solid state switch is a PNP BJT.

5. The circuit of claim 4, wherein the third solid state switch is an N-channel junction field-effect transistor (JFET).

6. The circuit of claim 1, wherein the solid state switch controller includes an optocoupler.

7. The circuit of claim 6, wherein:
   when the solid state switch controller is powered, the optocoupler is configured to pull the third switch gate to a negative voltage to turn the third solid state switch off; and
   when the solid state switch controller is unpowered, the third switch gate is configured to be grounded.

8. The circuit of claim 1, further comprising a first resistor disposed on the input line and configured to allow current sensing.

9. The circuit of claim 8, further comprising:
   a second resistor connected to the second switch collector in parallel with the first switch base on a first side of the second resistor, wherein the second resistor is connected to the ground on a second side of the second resistor; and
   a third resistor connected to the input line in parallel with the first switch collector and the second switch emitter on a first side of the third resistor, wherein the third resistor is connected to the third switch drain in parallel with the second switch base on a second side of the third resistor;
   wherein the second resistor and the third resistor are configured to reduce leakage current to prevent the first solid state switch and the second solid state switch from turning on when the third solid state switch is off.

10. The circuit of claim 9, further comprising:
    a fourth resistor connected between the third switch gate and the ground, wherein the fourth resistor is connected to the third switch gate in parallel with the solid state switch controller.

11. The circuit of claim 1, wherein at least one of:
    current on the input line is between 0.1 A to 1 A steady state current; or
    the current on the input line is between 1 A to 10 A transient current.

12. The circuit of claim 1, wherein the circuit only has solid state components.

13. A low-side contactor coil drive circuit, comprising:
a plurality of solid state switches, at least one of the plurality of solid state switches configured to pass a load current;
a normally-on solid state switch that is not capable of passing the load current, the normally-on solid state switch operatively connected to the plurality of solid state switches and configured to control a state of the plurality of solid state switches; and
a solid state switch controller connected to the normally-on solid state switch and configured to control a state of the normally-on solid state switch;
wherein, when the solid state switch controller is unpowered, the normally-on solid state switch is on; and
wherein, when the solid state switch controller is powered, the solid state switch controller is configured to pull a gate of the normally-on solid state switch low to turn the normally-on solid state switch off.

14. The circuit of claim 13, wherein the plurality of solid state switches include an NPN bipolar junction transistor (BJT), a PNP BJT, and an N-channel junction field-effect transistor (JFET).

15. The circuit of claim 13, wherein the solid state switch controller includes an optocoupler.

16. The circuit of claim 13, wherein the normally-on solid state switch includes a characteristic on-state drain-source resistance such that current through the normally-on solid state switch is substantially lower than current on an input line.

17. The circuit of claim 13, wherein, when the solid state switch controller is unpowered, the gate of the normally-on solid state switch is grounded.

18. The circuit of claim 13, further comprising:
a resistor disposed on an input line and configured to allow current sensing, the resistor coupled to the plurality of solid state switches.

19. The circuit of claim 13, further comprising:
a resistor connected between the gate of the normally-on solid state switch and ground, wherein the resistor is connected to the normally-on solid state switch in parallel with the solid state switch controller.

20. A method comprising:
providing an input from an input line to a plurality of solid state switches, at least one of the plurality of solid state switches configured to pass a load current;
controlling, using a solid state switch controller, a state of a normally-on solid state switch, the normally-on solid state switch not capable of passing the load current, the normally-on solid state switch operatively connected to the plurality of solid state switches and controlling a state of the plurality of solid state switches;
wherein, when the solid state switch controller is unpowered, the normally-on solid state switch is on; and
wherein, when the solid state switch controller is powered, the solid state switch controller pulls a gate of the normally-on solid state switch low to turn the normally-on solid state switch off.

* * * * *